United States Patent [19]
Face, Jr. et al.

[11] Patent Number: 6,013,972
[45] Date of Patent: Jan. 11, 2000

[54] PIEZOELECTRIC VIBRATING APPARATUS

[76] Inventors: Samuel A Face, Jr., 1008 Magnolia Ave., Norfolk, Va. 23508; Glenn F. Rogers, Jr., 6 Renee Ct., Hampton, Va. 23664; Richard P. Bishop, P.O. Box 10495, Fairfax Station, Va. 22009

[21] Appl. No.: 08/950,939

[22] Filed: Oct. 15, 1997

[51] Int. Cl.⁷ .................................................. H01L 41/04
[52] U.S. Cl. ........................ 310/332; 310/328; 310/330; 310/331
[58] Field of Search .................... 310/328, 330, 310/331, 332

[56] References Cited

U.S. PATENT DOCUMENTS

| | | | |
|---|---|---|---|
| 3,247,404 | 4/1966 | Batsch | 310/331 |
| 3,622,815 | 11/1971 | Schafft | 310/332 |
| 4,533,849 | 8/1985 | Schnell | 310/330 |
| 4,538,087 | 8/1985 | Germano et al. | 310/332 |
| 4,575,697 | 3/1986 | Rao et al. | 310/331 |
| 4,595,338 | 6/1986 | Kolm et al. | 310/330 |
| 4,633,121 | 12/1986 | Ogawa et al. | 310/332 |
| 4,742,260 | 5/1988 | Shimizu et al. | 310/330 |

*Primary Examiner*—Nestor Ramirez
*Assistant Examiner*—Peter Medley

[57] ABSTRACT

A vibrating mechanism comprised of piezoelectric elements which vibrate at a high frequency when a voltage is applied to them. The piezoelectric elements are mounted on a rib so that their free ends extend from the rib. When the piezoelectric elements are energized the free ends vibrate with a "wing-flapping" motion. Weights may be attached to the free ends of the piezoelectric element to increase the inertial component of vibration. In the preferred embodiment of the invention, the piezoelectric elements are prestressed. The invention will be an inexpensive substitute for other vibratory devices.

9 Claims, 9 Drawing Sheets

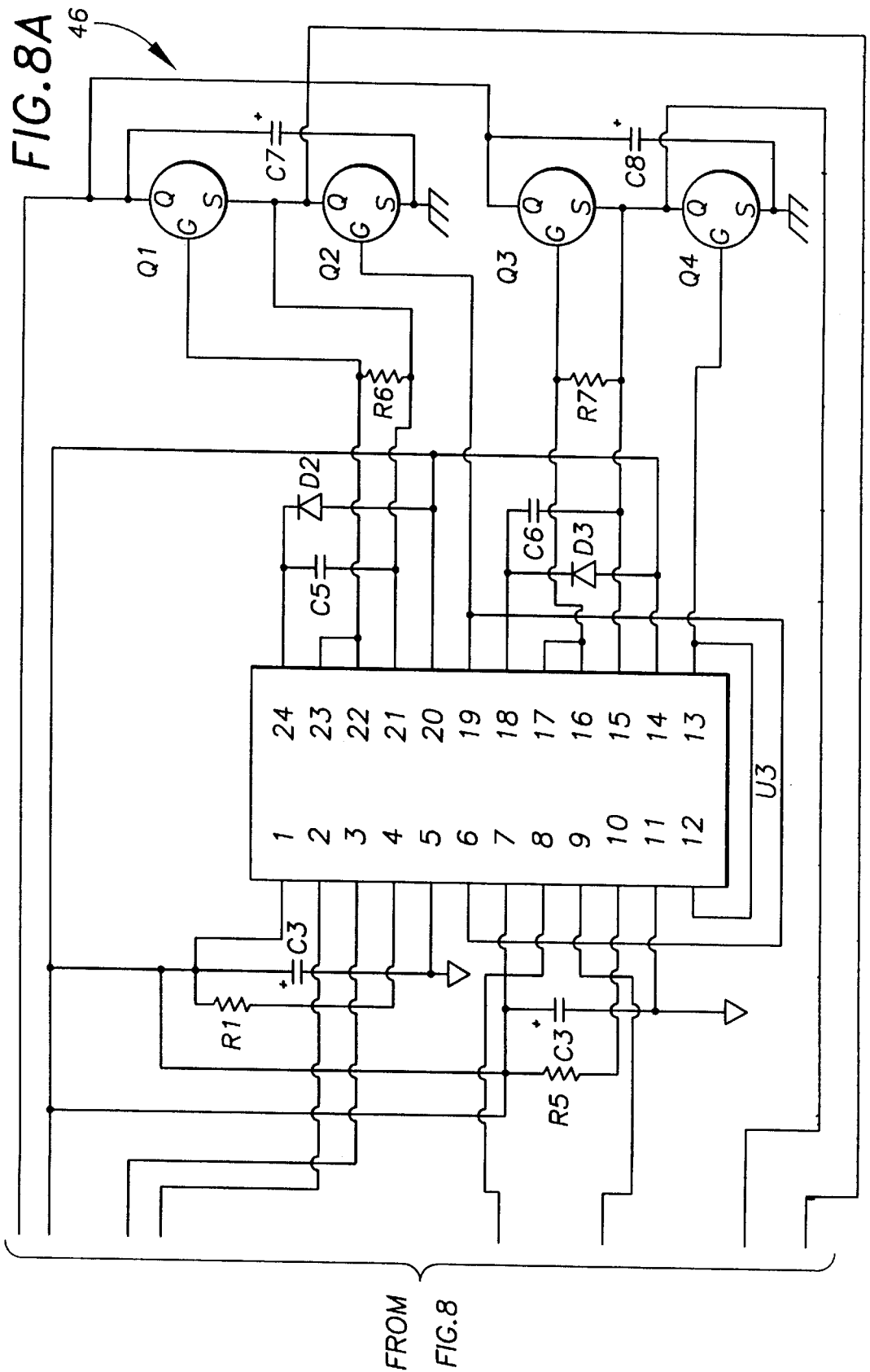

PIEZOELECTRIC VIBRATING APPARATUS

BACKGROUND OF THE INVENTION

1. Field of Invention

The present invention relates to vibrating tools. More particularly the present invention is directed to vibrating, hand-operated, surface-finishing tools.

2. Description of the Prior Art

The present invention is a unique vibrating tool which may advantageously be used to modify the texture or character (i.e. the "finish") of a surface of a work material. The following disclosure principally describes the preferred embodiment of the invention and its use in advantageously finishing an exposed surface of a plastic concrete mass. It will be understood, however, that similar tools constructed in accordance with the present invention may be used to modify the texture or character of an exposed surface of many other materials, particularly plastic or wet materials such as plaster, wet soil, cement and the like.

After concrete is initially laid, it must be worked while it is wet in order to provide a smooth, homogeneous mixture. Working the concrete helps settle the concrete and helps to densify and compact the concrete during finishing. The working also removes air voids and brings excess water and fine aggregates to the surface for subsequent finishing.

After the initial finishing stages are complete a more detailed work frequently commences, generally by means of a hand-held float in attempting to further compact the concrete for purposes including the driving of suspended gravel downwards, and developing a wetted surface slurry or soup-like finish, while further driving out air pockets and the like for preparing the surface for final finishing. Thereafter, when the surface slurry is thus formed, it is conventional to employ a smoothing or finishing trowel to develop a very smooth surface, and to employ specialty tools (such as edgers) to provide finishing touches to the work (such as curved edges or the like).

It is generally known that, if not worked, the surface of wet concrete would take on a highly undesirable rough and uneven finish which, after partial setting of the concrete, would render the surface difficult if not impossible to finish to the desired smooth and even consistency.

For this reason, it has long been known in the art that in the act of providing a first general compacting, tamping, screeding or other such operation following the laying or dumping of the mix, various large vibrating devices may be beneficially employed. Illustrative embodiments of such large vibrating tampers or the like may be seen in U.S. Pat. No. 3,306,174 to Wardell, U.S. Pat. No. 2,289,248 to Davis, U.S. Pat. No. 1,955,101 to Sloan, and U.S. Pat. No. 2,209,965 to Mall. These devices generally include a rather large flat base plate, a heavy and bulky vibratory mechanism disposed thereon, and an elongate handle attached thereto for moving the large plate across the concrete surface. Such devices are generally intended to provide a general smoothing and compacting operation over a large area.

When the worker has progressed to the aforementioned finishing stage wherein it is desired to provide a highly smoothed surface finish, a variety of prior vibrating hand trowels may be employed with varying degrees of success. Representative examples of such trowels which are primarily for smoothing or finishing work, may be seen in U.S. Pat. No. 3,376,798 to Bodine, U.S. Pat. No. 2,514,626 to Clipson, and U.S. Pat. No. 2,411,317 to Day et al. Although these trowels are intended for hand-held operation, as opposed to the aforementioned larger devices, they still retain several characteristics of the larger devices such as being awkward, large and heavy in construction, illustrative of which is the device of Day et al. Whereas such features may in fact be beneficial with respect to the larger devices, in a hand-held tool this bulk, weight, and complexity may render the tool totally impractical for use, particularly in view of the fact that the operator is typically working for long periods of time on his knees and often in awkward positions. It must be recognized that these trowels are conventionally used primarily in the finishing operations wherein a great deal of vibratory energy is not required inasmuch as a mere final smoothing of the surface slurry is being effected. In these instances, a much less bulky vibrating means might be provided although, as discussed above, most designs nevertheless continue to suffer from undue weight, bulk and the like. Notwithstanding, a variety of such vibrating means have been attempted to be employed including plunger-type vibrators (as disclosed in the patent to Clipson), air driven turbine vibrators (as disclosed in the patent to Day), and even sonic air-driven orbiting-mass type vibrators (as illustrated in the patent to Bodine).

Another prior vibrating hand trowel is disclosed in U.S. Pat. No. 5,234,283 to Adkins. In this trowel the vibratory mechanism is mounted inside the handle. The vibratory mechanism vibrates a rigid metal blade of relatively large mass by "pushing off" of the handle in an oscillating fashion. An inherent consequence of this construction is that the handle vibrates as much or more than the blade of the trowel which contacts the wet concrete. These vibrations cause discomfort and difficulty of use for the operator. As a means of reducing the amount of uncomfortable vibrations transmitted through the handle to the operator, this device, in practice, is typically manufactured such that the handle/vibrator mechanism is of relatively high mass. As discussed above with respect to other prior vibrating finishing tools, it is undesirable for such trowels to be heavy and bulky. Also, because only one vibrating mechanism (i.e. located in the handle and attached to the blade of the trowel at one point) is used to drive the entire blade, the blade must be constructed of particularly rigid, (and therefore frequently heavy and thick) material in order to cause the entire blade to vibrate in phase. A more desirable hand tool would incorporate characteristics that would cause the majority of the vibratory energy to be transmitted to the work concrete through the bottom of the device in an efficient and uniform manner and not to the operator through the handle.

Prior patents in this art are relatively silent regarding determination of the frequency at which the vibrations should be applied to the work concrete. Because little attention is given in the prior art to the importance of determination of the frequency at which vibrations should be applied to the work material, prior vibrating concrete finishing tools typically are not provided with means by which tools' vibration frequencies can be readily changed by the user. Consequently, many prior devices do not vibrate the concrete very efficiently. Most prior concrete finishing vibrating hand tools are operated simply by turning a switch having only two settings: on or off. However, in practice each batch of concrete delivered to a job site is different from the next, and a different frequency of vibration may be required from one batch to another in order to cause the desired slurry to be formed more quickly and more efficiently. This is because the natural frequency of each batch may be different due to the amount of water, concrete and aggregate mix that make up each particular batch. Accordingly, it is desirable to provide a vibrating hand tool with multiple frequency settings.

Another problem with the prior art relates to the bulk of the device itself, as well as the bulk of the power supply. Some prior vibrating hand trowels (such as the one disclosed in the patent to Adkins) consist of an electric cord running from the tool to a bulky battery pack which is mounted in a belt and placed around the operator's waist. Because of the low electrical-to-mechanical power transmission efficiency, and because of the low vibrational energy inefficiency from the actuator to the work medium of prior devices, it is typically necessary to provide such prior devices with large power supplies. Thus, prior vibrating concrete finishing tools are typically provided with battery packs which are large and heavy, and, if worn on a waist belt, uncomfortable to the operator. In addition, in such prior devices the length of the cord is such that it may be inadvertently dragged through the concrete. A hand trowel with either a battery pack in the handle or a less bulky hip-pack with a shorter cord would therefore be more desirable.

Prior methods of smoothing plastic concrete using a hand trowel are not effective in removing water or air pockets that may be trapped in the concrete. A simple hand trowel typically consists of a handle and a flat metal blade. The trowel is used to smooth the top layer of poured concrete, but has little effect on water or air below the surface of the concrete. Conventional hand trowels are also hard to use near walls or corners because they must be wiped back and forth over the surface of the plastic concrete and the wall often is an obstruction. Conventional hand trowels are also difficult to use for long periods of time because of the high amount of friction between the blade of the tool and the concrete.

Gasoline powered vibrating finishing tools cause noise pollution, harmful exhaust emissions, and do not produce a high enough output frequency to effectively vibrate the medium. They also are hard to control and virtually impossible to use in closed quarters or at edges and corners, because they are large and bulky and do not operate well adjacent protruding vertical structures (i.e. walls).

Other types of prior vibratory hand tools are difficult to handle because, when the vibration is applied, the entire tool vibrates causing difficulty for the operator.

SUMMARY OF THE INVENTION

The present invention provides a small, lightweight, vibratory surface finishing tool. In a preferred embodiment of the invention, the tool is a hand trowel with a high output frequency for finishing plastic concrete. The general purpose of the invention is to provide a vibrating hand trowel which is easy to use for the operator, and which overcomes the aforementioned disadvantages of the prior art.

The vibratory action of the tool is generated by one or more piezoelectric elements which, when energized vibrate at a high frequency. In the preferred embodiment of the invention, the vibrations are transferred through a blade at the bottom of the trowel and into the plastic concrete. This vibration causes air and water to rise to the surface of the concrete creating a layer of water on the surface of the concrete. This water advantageously lubricates the trowel, making for easier use, and creates a slurry which is desirable for producing a smooth surface finish. The vibrations are at such a high frequency and the displacement of the bottom of the trowel is so small that the operator can barely feel the vibrations through the tool's handle. This, coupled with the lightweight design and other characteristics described hereinbelow, makes the trowel very easy to handle and operate, especially in previously difficult to finish areas such as edges and corners.

Accordingly, it is a primary object of the present invention to provide a lightweight, energy efficient, piezoelectrically-actuated vibrating surface finishing tool.

It is another object of the present invention to provide handheld concrete/cement working tools of an automatically vibrating variety wherein a substantial vibratory energy is imparted to the concrete surface.

It is another object of the present invention to provide a device of the character described which is at the same time compact, light in weight, and of an extremely simple and uncluttered design.

It is another object of the present invention to provide a device that is effective in creating a smooth and wet top layer in the plastic concrete for lubrication of the tool and a smooth finish of the concrete.

It is another object of the present invention to provide a device of the character described in which there is minimal vibration transmitted through the handle (and subsequently to the operator) in proportion to the amount of vibration transmitted through the bottom of the device and into the concrete.

It is another object of the present invention to provide a device of the character described in which the piezoelectric element(s) is(are) protected from damage within a sealed interior chamber.

It is another object to provide a modification of the present invention in which the vibratory energy is imparted into the concrete in the frequency range of 50 to 500 hertz.

It is another object to provide a modification of the present invention in which the frequency of vibration is easily user-modified.

It is another object of the present invention to provide a device of the character described which is battery powered.

It is another object of the present invention to provide a device of the character described which is of a modular design such that several of the devices can be connected so to create a larger working surface area.

It is another object of the present invention to provide a device of the character described in which the working area of the device can be increased or decreased, as desired, by adding or removing, respectively, vibrator modules.

Further objects and advantages of this invention will become apparent from a consideration of the drawings and ensuing description thereof.

DESCRIPTION OF THE PREFERRED EMBODIMENT

Figure 1:
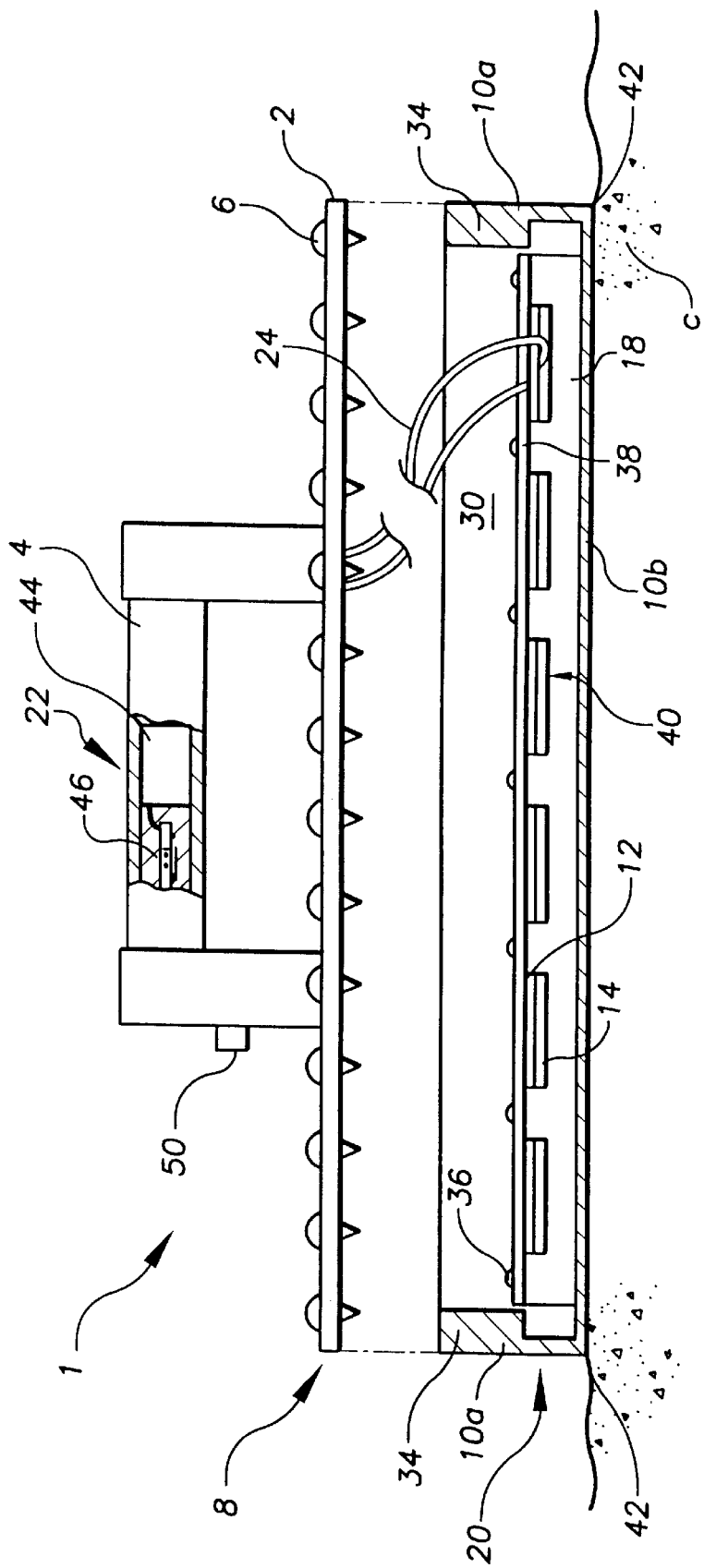
FIG. 1 is a cross-sectional exploded side view showing a piezoelectrically actuated hand trowel in elevation in accordance with the present invention.

With initial reference directed toward FIG. 1 of the appended drawings a piezoelectrically actuated vibrating hand trowel embodying the principles and concepts of the present invention and generally designated by the reference numeral 1 will be described.

The top piece 8 comprises a handle 4 which is attached to a thin cover plate 2 by conventional methods such as gluing, welding, threaded fasteners (not shown) or the like. The cover plate 2 is preferably made of a lightweight thin metal (such as aluminum) which will readily deform when subjected to vibrations in the manner set forth herein below. This allows any vibrations which may be inadvertently transmitted to the cover plate 2 from the base 20 to be dissipated in the cover plate 2, rather than being further transmitted to the handle 4. The cover plate 2 has a series of screws 6 around its perimeter by which the cover plate 2 is secured to the base 20 of the trowel.

The base 20 comprises an outer shell housing 10 which is preferably made of a lightweight electrically insulating material such as nylon, or which may alternatively be made of other insulating materials such as PVC, or electrically conductive materials such as a thin metal. By way of example only, in the preferred embodiment of the invention, the base 20 may be approximately 3.75" wide× approximately 12.5" long×approximately 1" high. The nylon shell 10 is hollow and surrounds an interior cavity 30. The sides of the shell 10 are semi-rigid, and the bottom 10b of the shell is very thin (preferably 0.040" to 0.060" inches), allowing for its controlled deformation. The material used to make the bottom 10b must be sufficiently flexible that it can deform in a substantially vertical direction when exposed to vertical forces from actuators 12 located within the cavity 30. Around the sides of the shell 10a is a rib 34 with a series of tapped holes 32 for engagement with screws 6 which are used to attach the top piece 8 to the base 20.

Figure 2:
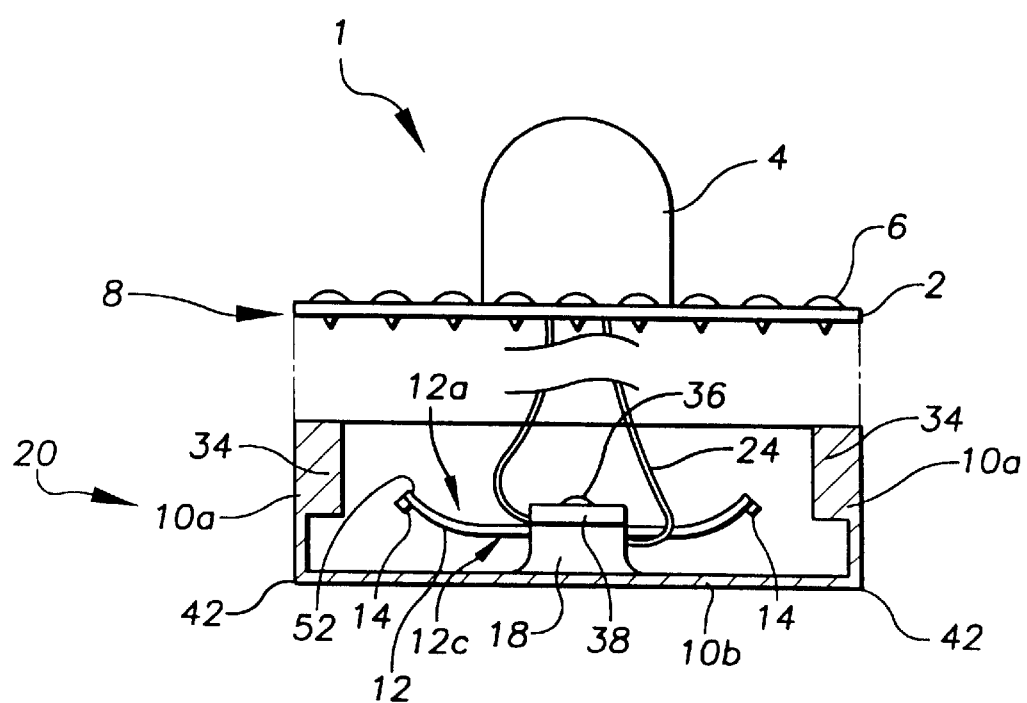
FIG. 2 is a cross-sectional exploded end view of hand trowel shown in FIG. 1.
Figure 3:
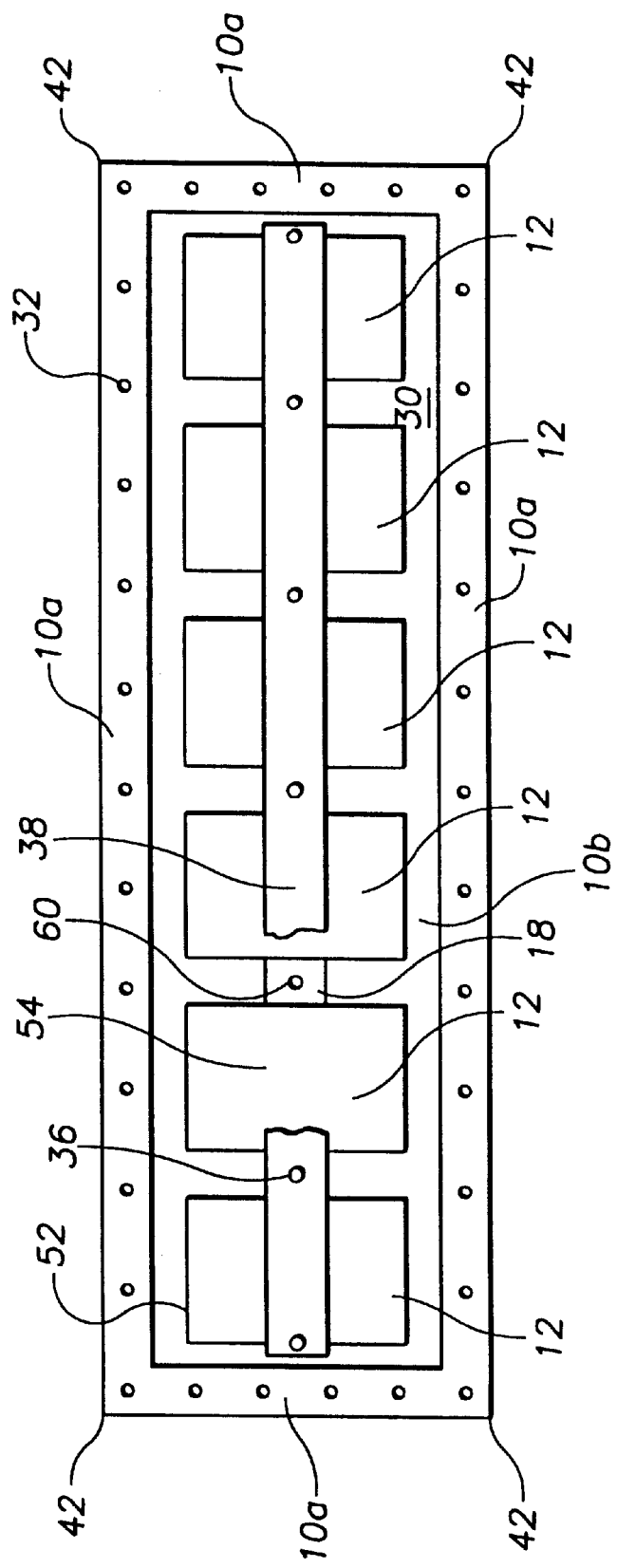
FIG. 3 is a plan view of the piezoelectric hand tool with the top piece and handle removed to show the interior cavity.
Figure 5:
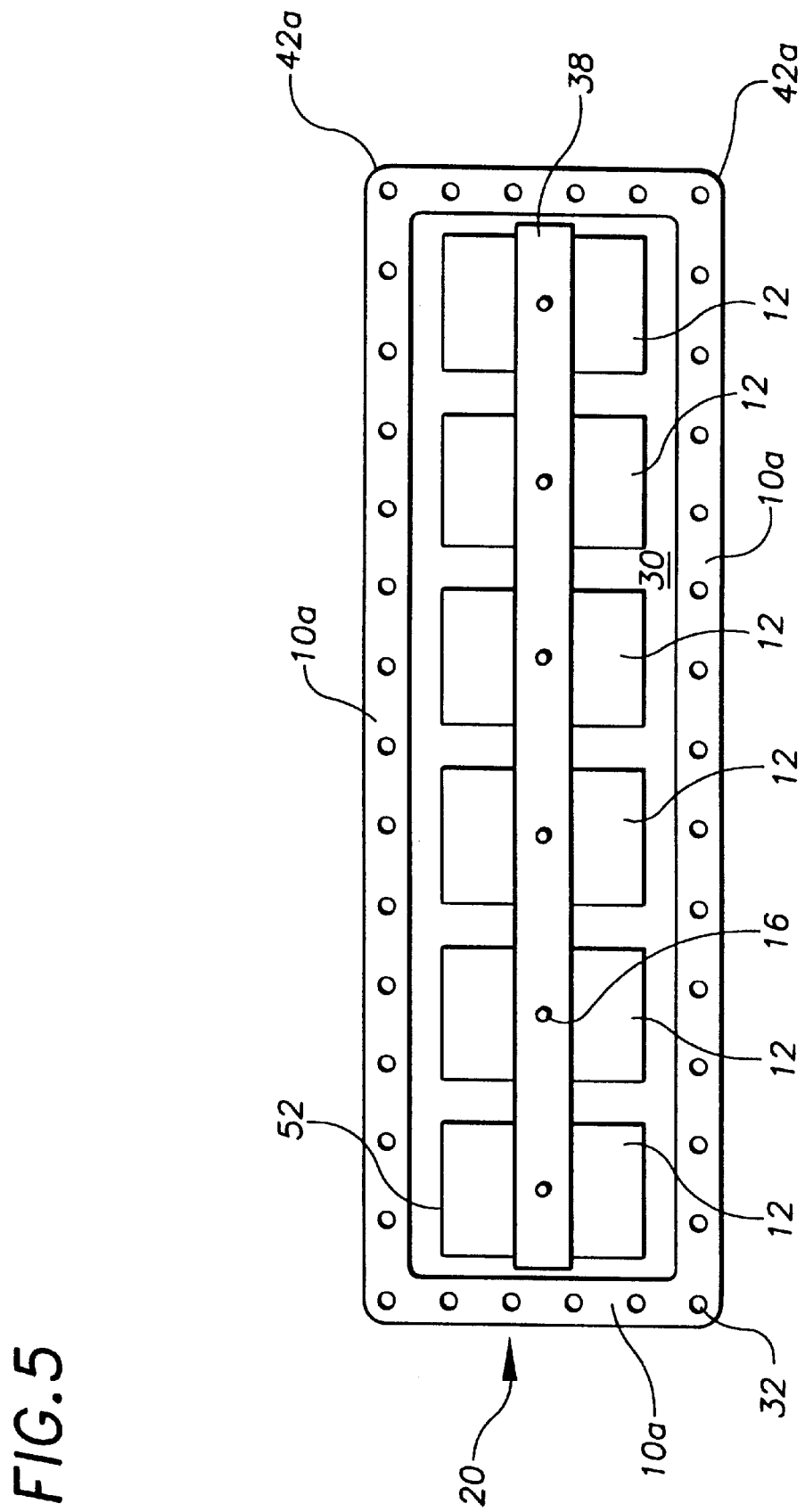
FIG. 5 is a plan view of a modification of the present invention illustrated with the top piece and handle removed to show the interior cavity.
Figure 6:
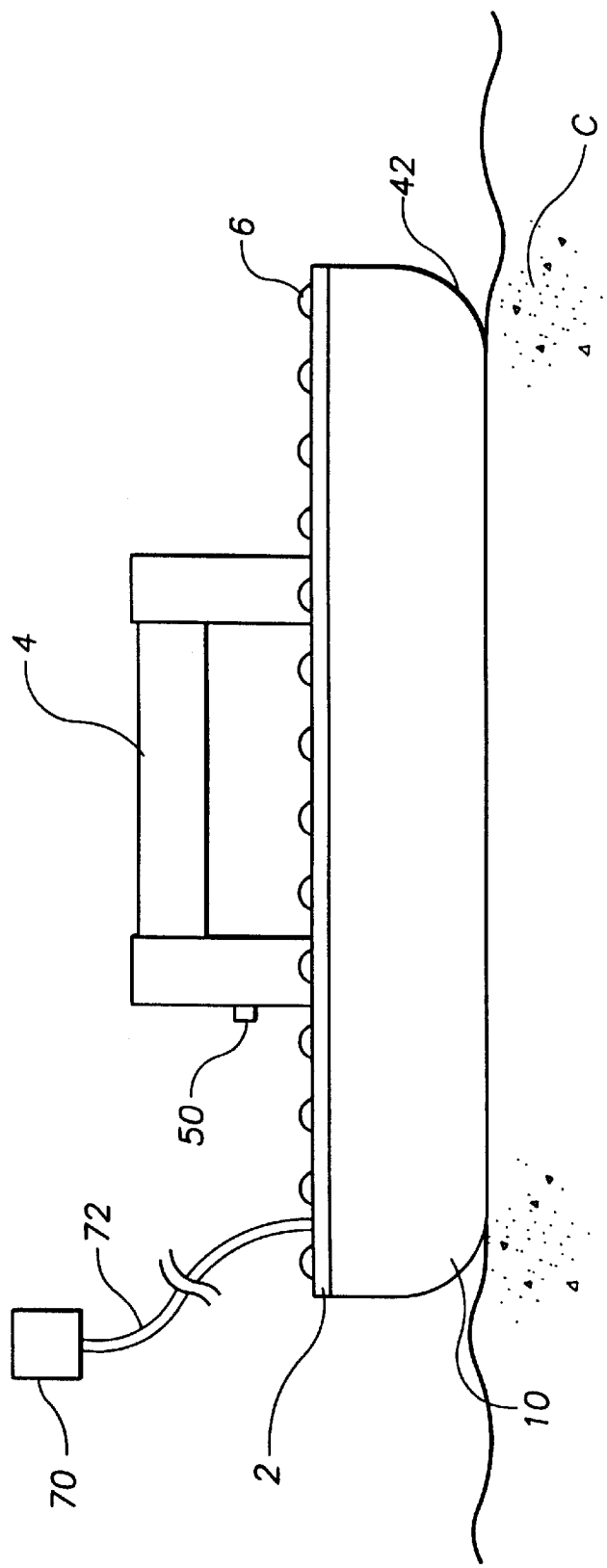
FIG. 6 is a side view of view of the piezoelectrically actuated hand trowel.

Running longitudinally along the middle of the shell 10, inside of the base 30, is another rib 18. In the preferred embodiment of the invention the rib 18 is made of Phenolic. This rib 18 is attached to the bottom 10b of the shell 10 by a conventional method such as gluing (not shown). Attached to this rib 18 is a series of approximately six prestressed piezoelectric ceramic actuator elements 12. The actuator elements 12 are aligned along the rib 18 in an equally spaced manner. Each actuator element 12 straddles and is secured to the rib 18 with the normally concave face 12b of the actuator element 12 directed upward, as illustrated in FIG. 2. In a modification of the invention the actuator elements 12 may be secured to the rib 18 with their normally concave faces 12b directed downward. Preferably, each actuator element 12 is placed in a recess or notch 40 in the rib 18. The actuator elements 12 are held in place by a bar 38 which is approximately the same length and width of the rib 18 and which is placed over the actuator elements 12 and secured to the rib 18 with screws 36 at holes 60 tapped between the actuator elements 12. This bar 38 is preferably made of an insulating material. In a modification of the present invention, as illustrated in FIG. 5, each actuator element is attached to the rib 18 by a screw 16 through its center instead of placing the actuator elements 12 in a notch 40, and placing the screws 36 between the actuators 12. Preferably, the shell 10 has square corners 42 (as illustrated in FIG. 2 and FIG. 3) to enable the user to reach tight areas easily. However, it may alternatively have rounded corners 42a, as illustrated in FIG. 5 and FIG. 6, to allow the trowel 1 to move over the concrete more easily and prevent buildup of water and slurried concrete in front of the moving trowel as the device moves across the surface of the plastic concrete C.

As stated above, the cover plate 2 is preferably very thin. This is to allow any vibrations that are transmitted into the cover plate 2 to be dissipated before reaching the handle 4. This also allows more vibrations to be transmitted to the bottom 10b of the trowel 1 than would result if a thicker, more rigid material were used. These characteristics of the cover plate 2 increase the comfort for the operator, and increase the overall efficiency of the tool.

The bottom 10b of the trowel 1 must be made of a flexible material in order to optimize the transmission of vibrational energy through the bottom 10b of the trowel to the concrete C. Flexibility is an advantageous characteristic because it allows use of a material (e.g. nylon) that is lighter, easier to assemble and more cost-effective than the thick, more rigid materials, (such as steel plate), used in prior vibrating hand tools. In the preferred embodiment of the present invention, nylon is used. A further advantage of using a flexible material is that it lends itself to the use of electrically insulating materials (such as nylon). It will be appreciated that by constructing the base out of an electrically insulating material, the possibility of accidently shorting the electrical circuit to the actuator elements 12 is minimized.

As illustrated in FIG. 2, connected at opposite ends of the actuator elements 12 is a small weight 14. Each weight's 14 height is preferably the same as its width and its length is preferably the same as the width of the actuator element 12. The weight 14 may be attached to the actuator element 12 by solder 68, glue or similar means. By attaching the weights 14 to the ends of an actuator element 12, the magnitude of the momentum which can be developed by oscillating the actuator element 12 at any given frequency can be increased by an amount which is approximately proportional to the mass of the attached weights 14. It will be understood that, in order to transmit a given amount of vibrational energy from an oscillating actuator element 12 to the bottom 10b of the shell (and thence to the work surface of a concrete mass C), a lower frequency of oscillation is required for an actuator element having weights 14 attached in the manner described than would be required of an actuator element 12 alone.

It will also be understood that if the frequency of the electrical power supplied to the actuator element corresponds to a natural frequency of oscillation of actuator element 12 and attached weights 14 combination, then the amount of electrical energy required to oscillate the combination at a given amplitude of oscillation can be minimized.

Accordingly, it will be appreciated that by constructing the actuator element 12 and weights 14 in accordance with the foregoing description, and applying electrical energy to the actuator elements 12 at a frequency corresponding to a natural frequency of oscillation of the combined actuator element 12 and attached weights 14, the magnitude of vibrational energy which can be generated and transmitted to the work surface of a plastic concrete mass C can be maximized while the amount of electrical energy input necessary to generate the vibrational energy output is minimized.

Each actuator element 12 has a wire 24 attached to each electrode 65. These wires 24 are also attached to an external common power supply 22. Electricity may be provided to each actuator element 12 by parallel wires 24 attached to corresponding electrodes 65 or the various actuator elements 12 may be connected in series. In a modification of the present invention, the top of the rib 18 and the bar 38 are each made of a conductive material to which the wires 24 are attached. In this modification of the invention the rib 18 and bar 38 each function as an electrical bus, obviating the attachment of wires to each actuator element 12. This cuts down on the amount of wires 24 that have to be used.

As illustrated in FIG. 1, the power supply 22 is preferably comprised of a battery pack 44 and control circuitry 46 which is housed within the handle 4. In a modification of the present invention the power supply 22 is a small, compact battery pack 70 worn around the operator's waist, and is connected to the control circuitry by a cord 72 as illustrated in FIG. 6.

Figure 8:
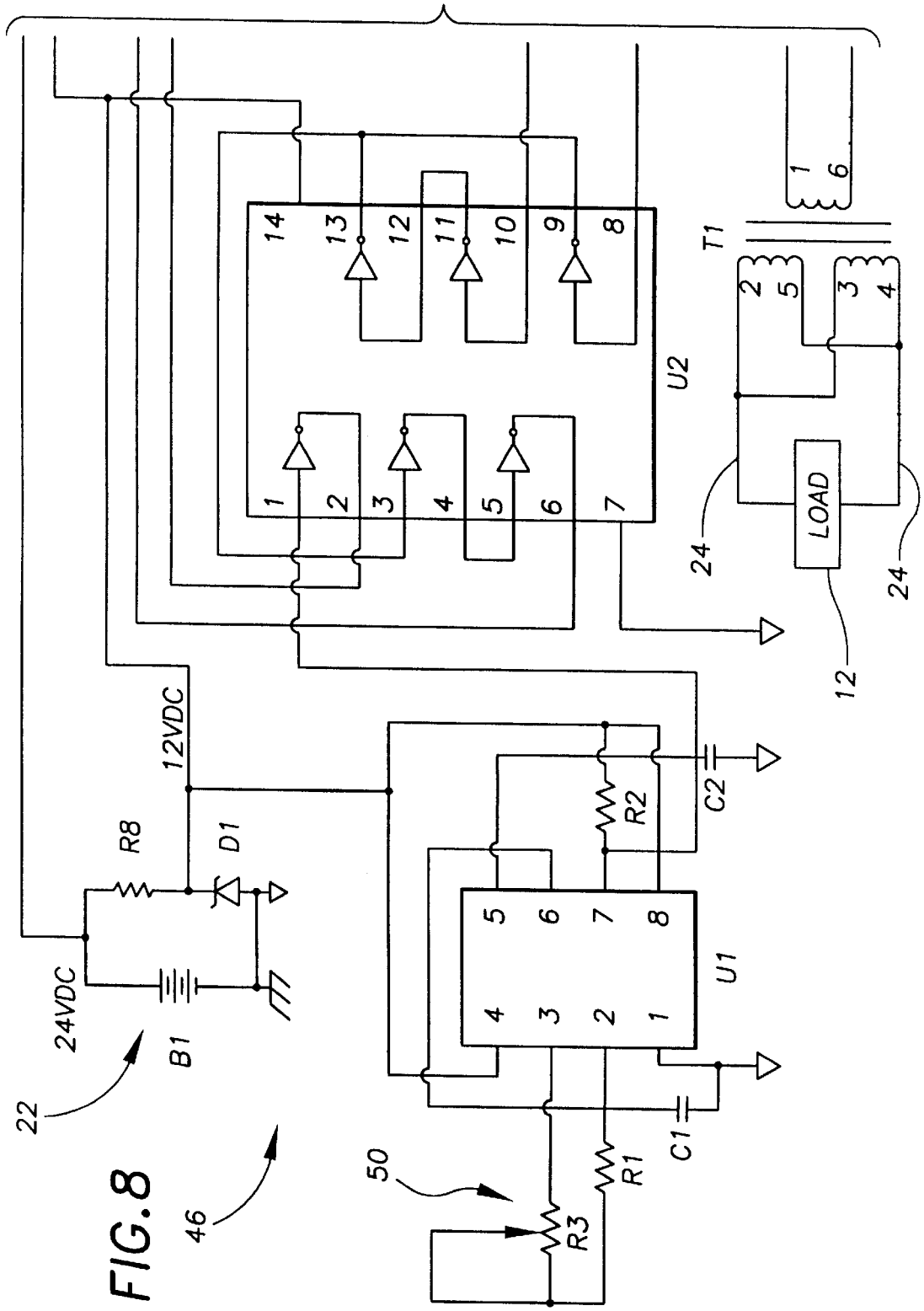
FIG. 8 is a schematic diagram of the electrical control circuitry of the preferred embodiment of the present invention.

The control circuitry 46 preferably comprises a regenerative electric circuit 46, such as that illustrated in FIG. 8. As will be explained more fully below, the regenerative electric circuit 23 optimizes the electrical-to-mechanical energy conversion efficiency of each actuator element 12 by supplementing electric power supplied to the device from the batteries 22 with piezoelectrically generated electricity produced by the mechanical deformation of the actuator element 12.

The actuator element 12 is a flextensional piezoelectric transducer. Various constructions of flextensional piezoelectric transducers may be used (including, for example, "moonies", "rainbows", and other unimorph, bimorph, multimorph or monomorph devices, as disclosed in U.S. Pat. No. 5,471,721), but the actuator element 12 preferably comprises a Thin Layer Unimorph Driver and Sensor ("THUNDER™") actuator constructed in accordance with the following description.

Figure 7:
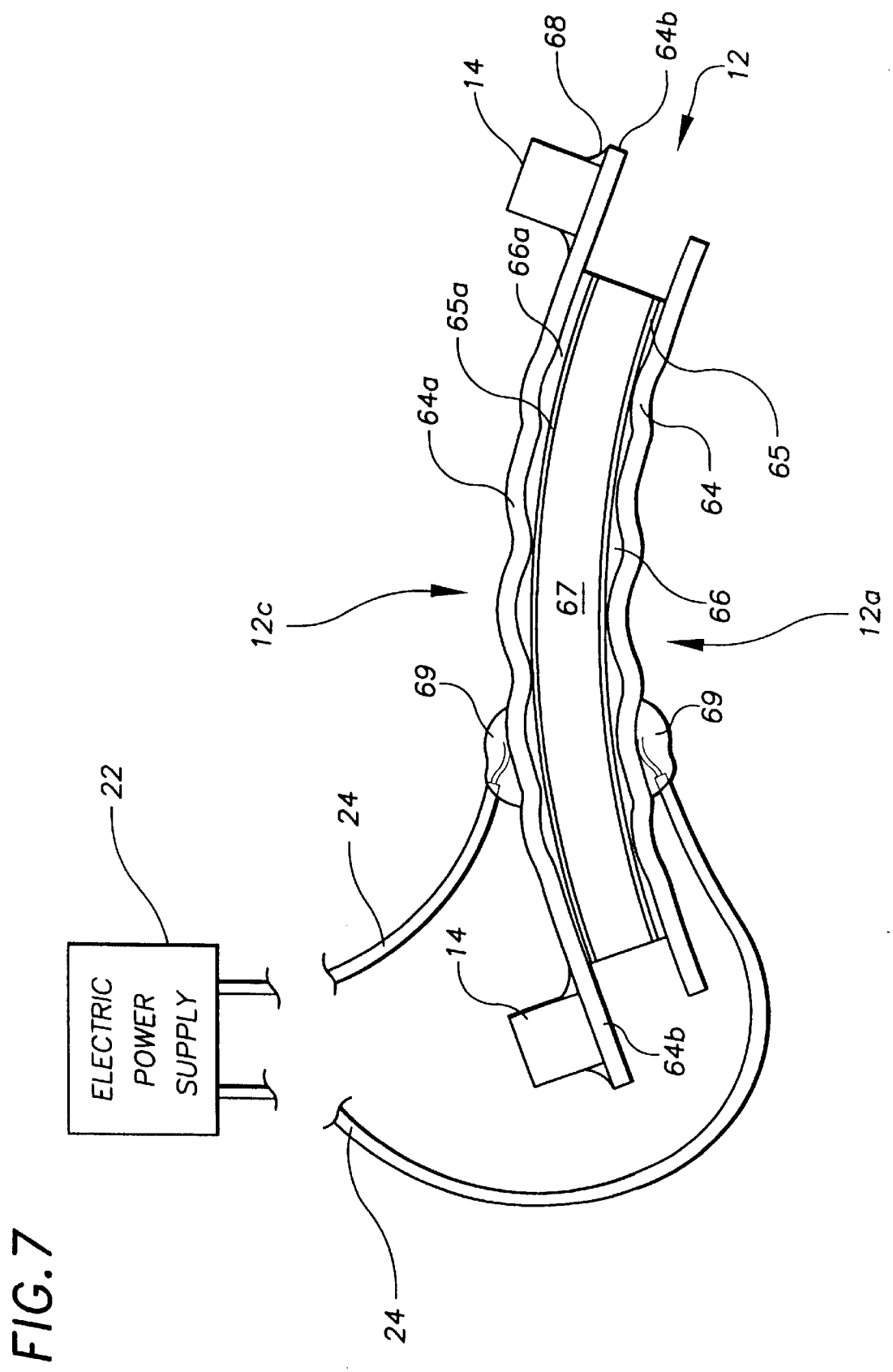
FIG. 7 is a side view showing details of construction of an actuator element with weights attached to its ends.

The THUNDER™ actuators 12 are composite structures such as is illustrated in FIG. 7. Each THUNDER™ actuator 12 is preferably constructed with a PZT piezoelectric ceramic layer 67 which is electroplated 65 and 65a on its two opposing faces. A steel, stainless steel, beryllium alloy or other metal first pre-stress layer 64 is adhered to the electroplated 65 surface on one side of the ceramic layer 67 by a first adhesive layer 66. The first adhesive layer 66 is preferably LaRC™-SI material, as developed by NASA-Langley Research Center and commercially marketed by IMITEC, Inc. of Schenectady, N.Y. A second adhesive layer 66a, also preferably comprising LaRC™-SI material, is adhered to the opposite side of the ceramic layer 67. During manufacture of the THUNDER™ actuator 12 the ceramic layer 67, the adhesive layers 66 and 66a and the first pre-stress layer 64 are simultaneously heated to a temperature above the melting point of the adhesive material, and then subsequently allowed to cool, thereby re-solidifying and setting the adhesive layers 66 and 66a. During the cooling process the ceramic layer 67 becomes compressively stressed, due to the higher coefficient of thermal contraction of the material of the pre-stress layer 64 than for the material of the ceramic layer 67. Also, due to the greater thermal contraction of the laminate materials (e.g. the first pre-stress layer 64 and the first adhesive layer 66) on one side of the ceramic layer 67 relative to the thermal contraction of the laminate material(s) (e.g. the second adhesive layer 66a) on the other side of the ceramic layer 67, the ceramic layer deforms in an arcuate shape having a normally concave face 12a and a normally convex face 12c, as illustrated in FIG. 7. One or more additional pre-stressing layer(s) 64a may be similarly adhered to either or both sides of the ceramic layer 67 in order, for example, to increase the stress in the ceramic layer 67 or to strengthen the actuator 12.

Electrical energy may be introduced to the THUNDER™ actuator 12 from an electric power supply 22 by a pair of electrical wires 24 attached to opposite sides of the THUNDER™ actuator 12 in communication with the electroplated 65 and 65a faces of the ceramic layer 67. As discussed above, the pre-stress layers 64 and 64a are preferably adhered to the ceramic layer 67 by LaRC™-SI material. The wires may be connected (for example by glue or solder 69) directly to the electroplated 65 and 65a faces of the ceramic layer 67, or they may alternatively be connected to the pre-stress layers 64 and 64a. LaRC™-SI is a dielectric. When the wires 24 are connected to the pre-stress layers 64 and 64a, it is desirable to roughen a face of each pre-stress layer 64 and 64a, so that the pre-stress layers 64 and 64a intermittently penetrate the respective adhesive layers 66 and 66a, and make electrical contact with the respective electroplated 65 and 65a faces of the ceramic layer 67.

As discussed above, in the preferred embodiment of the invention weights 14 are adhered 68 to the actuator 12 at opposite ends of one of the pre-stress layers 64 or 64a. In the preferred embodiment of the invention the weights 14 are adhered to the normally convex face 12c of the actuator (as illustrated in FIGS. 2 and 7), but they may alternatively be adhered to the normally convex face 12c of the actuator. To facilitate fastening of the weights 14 to the pre-stress layer 64a, and to increase the bending moment provided by the weights 14, tabs 64b extending beyond the corresponding ends of the ceramic layer 67 are provided at opposite ends of the pre-stress layer 64a.

It will be appreciated by those skilled in the art that by using an actuator element 12 comprising a pre-stressed piezoelectric element (e.g. THUNDER™ element) the strength, durability, and piezoelectric deformation (i.e. output) are each greater than would normally be available from a comparable piezoelectric element which is not pre-stressed. Accordingly, in the preferred embodiment of the invention it is desirable to employ actuator elements 12 comprising pre-stressed piezoelectric elements; however, non-pre-stressed piezoelectric elements may alternatively be used in modified embodiments of the present invention.

By way of example only, each THUNDER™ element 12 may be approximately 1.4" wide×2.0" long, and between 0.005" and 0.030" thick. The actuator elements 12 may be spaced approximately 0.5" apart and are sealed within the interior cavity 30 to protect them from damage. The spacing of the actuator elements 12 allows for uniform vibration along the bottom of the trowel 10b.

In operation, the hand trowel is placed upon the top surface of a plastic concrete mass C. An alternating electric current is applied to each of the actuator elements 12 via electric wires 24 connected to the power supply 22. Each actuator element 12 vibrates at a frequency corresponding to the frequency of the applied current. Preferably, the current is applied through a battery pack 44 in the handle 4. The character of the current transmitted to the actuator element 12 is controlled by a multi-position switch 50 which may be physically located on the handle 4 as illustrated in FIG. 1. In addition to turning the device off and on, the multi-position switch 50 is used to vary the frequency of the electrical signal to the actuator elements 12, (and, correspondingly) the frequency at which the actuator vibrates. In the preferred embodiment of the invention the multi-position switch 50 has settings corresponding to output frequencies of approximately 100 Hertz, approximately 200 Hertz, and a frequency corresponding to the natural resonant frequency of the entire bottom sub-assembly 20 of the trowel (including the rib 18, the actuator elements 12, the thin bottom piece 10b and their attachments). It has been found that by vibrating the actuator elements 12 at a frequency corresponding to the natural resonant frequency of the bottom sub-assembly 20 of the trowel, the trowel imparts the highest amount of vibrational energy into the concrete mass C and with optimal efficiency.

When energized by an alternating current in the manner described above, the actuator elements 12 (together with the weights 14) vibrate in a "wing-flapping" manner. The ends 52 of the actuator elements 12 vibrate up-and-down in a substantially vertical direction while the centers 54 of the actuator elements 12 remain substantially stationary against the longitudinal rib 18. The vibrational energy from this "wing flapping" motion of the actuator elements 12 is then transferred through the rib 18 and into the bottom 10b of the tool. The sides of the base 10a are constructed of sufficiently thick and rigid material that when the vibrational energy is applied to it from the actuator elements 12, the bottom 10b of the tool readily deforms, thereby transferring almost all of the vibrational energy directly to the plastic concrete mass C which is in contact with the bottom 10b of the tool. Because of these characteristics almost no vibration is transferred into the handle making the tool very easy and comfortable to use.

To optimize the energy efficiency of the device, the frequency of the electrical signal (and therefore the frequency of the vibrating actuator elements 12) is preferably selected to correspond to a natural frequency of the base sub-assembly (including the rib 18, the actuator elements 12, the thin bottom piece 10b and their attachments) of the assembled trowel. By way of example, for a trowel having the dimensions and construction described above, the frequency of the vibrations may typically be in the range of 90 to 350 Hertz.

In operation, the trowel is pulled across the top of a plastic concrete mass C. Water, air and fines near the surface of the concrete are forced to the top by the vibrational energy imparted to the medium through the bottom 10b of the tool. The water accumulates on the surface of the plastic concrete mass and creates a lubricant for the trowel, making it easier to move across the surface of the plastic concrete than would be possible with a conventional (i.e. non-vibrating) hand trowel. The fines and water which accumulates at the surface of the concrete create a slurry which is highly desirable for producing a smooth finished surface.

Because the "wing flapping" motion of the actuator elements 12 are principally along vertical axes, the bottom 10b of the base of the trowel predominantly oscillates in an up-and-down motion. For example, the bottom 10b of the base of a vibrating trowel constructed in accordance with the materials and dimensions described above may typically oscillate "up-and-down" approximately 0.010" or less; and any displacement of the sides 10a of the tool in the horizontal plane would typically be less than one-thousandth of an inch. As will be appreciated by those skilled in the art, because there is virtually no horizontal displacement or deformation of the sides 10a of the tool, and because the tool is relatively small and light-weight it is very easy to handle and is useful for working near edges and corners. As a result of these characteristics, less work output is needed by the operator.

Referring now to FIG. 8: The preferred embodiment of the invention comprises an electric circuit 46 in which the amount of electrical energy required to generate the desired mechanical vibrations are minimized, piezoelectrically generated electrically energy is recovered, the actuator elements 12 are prevented from over-heating, and the electrical-to-mechanical energy conversion efficiency of the actuator elements are maximized. An explanation of this preferred electrical circuit 46 follows: Active loads are loads which are capable of returning energy into the output of the source driving the load.

A piezoelectric transducer is an example of an active load. A piezoelectric transducer produces a potential difference (voltage) across itself when forced to expand or contract. Piezoelectric transducers have elements of resistance, capacitance, and inductance. Since both capacitors and inductors are energy storage devices, some of the energy driving the transducer is stored within the piezoelectric transducer.

Voltage is stored within the capacitive element of the piezoelectric transducer. This stored source voltage adds to the potential difference created by the expanded (or contracted) transducer, thus causing an elevated voltage which significantly increases with time and renders such a system unstable. This elevated voltage may be dissipated either by returning energy to the source or internally dissipating electrical energy across the resistive element of the transducer. Prior art includes a circuit which dissipates the elevated voltage when it exceeds a threshold by dropping the voltage across a Zener diode, making an inefficient use of the stored energy.

The elevated voltage creates problems when active loads are driven for even short periods of time (i.e. a few minutes). For example, as piezoelectric transducers are driven, the stored voltage increases with each successive expansion or contraction of the piezoelectric transducer. Eventually, the voltage either exceeds the source's capability to absorb the excess voltage, causing source failure, or the dielectric constant of the piezoelectric transducer is exceeded, resulting in the "arcing" and eventual "shorting" of the transducer. Excessive heat is also generated within the transducer as a result of this elevated voltage being dissipated across the resistive element within the piezoelectric transducer.

The present invention comprises a regenerative driver circuit 46 for piezoelectric transducers. The piezoelectrically generated electrical energy is captured, stored, and returned to the source voltage in a manner such that very little energy is necessary to expand (or contract) the transducer (e.g. actuator element 12). This circuit reduces the internal heat of the piezoelectric transducer (e.g. actuator element 12) by removing both the generated and stored potential differences of the piezoelectric transducer. Cooling the transducer in this manner yields a higher electrical-to-mechanical conversion efficiency of the actuator element 12 itself, thus lowering the amount power necessary to drive the load. The circuit also increases the life of the power supply by regulating energy returned to it.

FIG. 8 illustrates an electric schematic of the regenerative drive circuit 46. A battery B1 supplies 24 VDC to the driver circuit 46. A resistor R8 drops the source voltage to 12 VDC so that it can be used by integrated circuit chips U1, U2, and U3. Chip U1 is a CMOS timer chip which converts the direct current source voltage from battery B1 into a square wave. The frequency of the square wave produced by U1 may be varied by changing the value of the potentiometer R3. The square wave output from U1 is connected to the inputs of several Schmitt triggered inverters located in chip U2. These inverters have faster switching capabilities than regular inverters, thus peak rise times are faster resulting in a more square wave output. Schmitt inverters also reduce noise chattering at high frequencies.

Chip U2 produces two output signals. One signal is the inverse of the other. These two signal outputs, from pins 2, 6, 8, and 10 on chip U2, are connected to driver input pins 2, 3, 9, and 8 on the driver chip U3, respectively. The U3 chip controls the switching of four Metal Oxide Semiconductor Field Effect Transistors (MOSFETs), Q1–Q4. Driver input pins 2 and 9 are provided with inverted signals, while driver input pins 3 and 8 are provided with uninverted signals, thus creating a switching sequence which turns Q1 and Q2 "off" while Q3 and Q4 are on respectively. The switching sequence allows current from the battery to be alternated within the transformer. The alternating current is then "stepped up" to the "operating voltage" of the load using a transformer, T1. In this embodiment, T1 is a 4.1:1 ratio transformer, which steps the 24 volts provided by the battery B1 to 200 volts peak to peak. The "operating voltage" is simply the amount of voltage necessary to deform the load (piezoelectric actuator element 12). The MOSFETs, Q1–Q4, help provide the regenerative capability of the circuit. Their switching sequence allows the load the ability to dissipate energy by reversing the process discussed in the previous paragraph. Voltage stored within the load is "stepped down" and returned to the battery B1, resulting in an efficient use of energy stored and produced by the load (e.g. actuator element 12).

It will be understood from the above description that actuator elements 12 used in the present invention are very lightweight and comprise very few parts. Therefore, maintenance costs for the device are kept at a minimum. These characteristics are advantageous when compared to the bulk and intricacy of the motors, solenoids, etc., that are used in prior vibrating tools.

As can be seen by review of the above description the invention disclosed provides a vibrating hand trowel which is compact, light-weight and easy to use. The simplicity of the design provides for ease of maintenance and long-life. The invention also efficiently imparts a high amount of energy into the concrete and minimizes the vibrational energy dissipated through the handle and into the operator's hand. In the preferred embodiment of the invention, the device is battery operated and the frequency of the vibrations are readily adjustable. It will be understood from the foregoing description that when a hand-tool constructed in accordance with the present invention is pulled (or "wiped") across the surface of a plastic concrete mass it produces a water/fine slurry at the surface. The slurry lubricates the blade/concrete interface. As a result of the slurry and the lubrication a smooth surface finish is created without necessitating a back and forth wiping motion.

Figure 4:
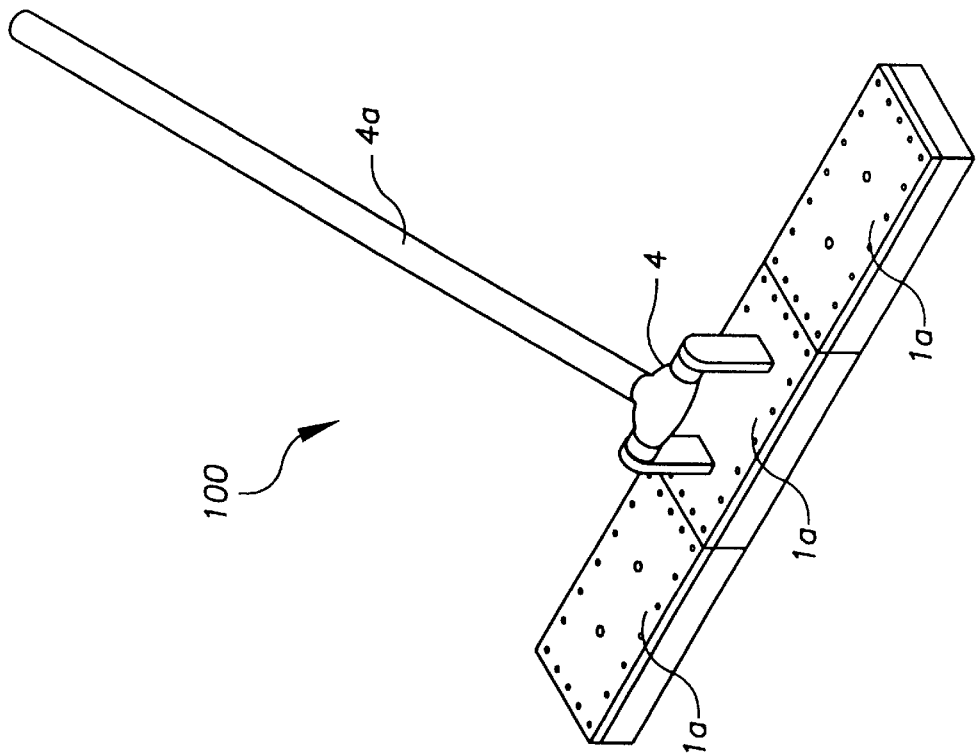
FIG. 4 is an isometric view of a multi-module vibrating tool.

Referring now to FIG. 4: In various modifications of the present invention, two or more vibrating tools constructed substantially as described herein above may be used as individual "modules" la, which may be assembled together to compose a larger, multi-module tool. An example of such a multi-module vibrating tool 100 is illustrated in FIG. 4. In the multi-module tool 100 shown in FIG. 4, three individual vibrating modules 1a (each constructed substantially in accordance with the preceding description of the preferred embodiment of the present invention) are attached to one another end-to-end. Adjacent vibrating modules 1a may be secured to each other by threaded fasteners (not shown) or similar fastening means; or the vibrating modules may alternatively be secured to a common chassis or frame (not shown). In the multi-module vibrating tool 100 illustrated in FIG. 4, the handles (which are used in the preferred embodiment of the invention) have been removed from the two outboard modules 1a, and an elongated handle 4a has been attached to the center module. Electrical power to the individual modules 1a may be provided by a common power supply located inside of the elongated handle 4a, inside of the center handle 4, on an operator-worn belt, or elsewhere. Alternatively, each individual module 2a may be provided with its own individual power supply, as described above with respect to the preferred embodiment of the invention.

It will be appreciated that a multi-module tool constructed in accordance with the foregoing description can be advantageously operated in substantially the same manner as the preferred embodiment of the invention, by an operator in a standing position, and that such a tool may be advantageously used to finish remote, or difficult to reach areas, without requiring that the operator stand or kneel in the wet concrete.

Although FIG. 4 illustrates a multi-module vibrating tool 100 having three vibrating modules 1a arranged end-to-end, it will be understood that any number of vibrating modules 1a may be used, and that the modules may be oriented side-to-side, or staggered, or in other configurations. Also, although it is preferable that the various modules 1a of a multi-module vibrating tool 100 be similar size and construction, and that the each vibrate at the same frequency (i.e. corresponding to identical natural frequencies of their respective base assemblies), it is within the scope of the present invention to construct multi-module vibrating tool 100 in which the various modules 1a are of differing sizes and which vibrate at varying frequencies.

While the above description contains many specificities, these should not be construed as limitations on the scope of the invention, but rather as an exemplification of one preferred embodiment thereof. Many other variations are possible, for example:

A power cord that may be provided for connection to a typical a/c wall outlet, creating a frequency of 60 Hertz. This design would lend itself to ease of use and cut down on recharging time and part's costs;

The actuators may be normally curved when non-energized, or they may alternatively be normally flat when non-energized, and, if normally, flat, may be secured to the rib 18 with either face directed upward;

The rib 18 may be replaced with a series of individual bosses to which individual actuators may be attached;

The weights may be removed to allow the actuator elements 12 to vibrate on their own;

The weights 14 may alternatively be secured to the actuator elements a finite distance inboard of the edge of the actuator element, and the weights need not necessarily be square or rectangular in cross-section;

The actuators may be arranged into various arrays, and need not necessarily be located in a single line down the middle of the base of the tool;

The blade of the tool may be modified so that the tool may be used as a polisher, a sander, or a mixer;

The tool may be used to vibrate or smooth plastic/slurry mixtures other than concrete;

The tool may be constructed with larger dimensions and/or comprising vibrator modules so that it can be used as a screed, a float, an edger or other similar concrete finishing tools;

Non-"THUNDER™" piezoelectric actuators, including magneto-strictive, and ferroelectric, may be used to produce the vibrations;

The rib 18 may be carved out of or molded to the base 10 instead of being a completely separate piece;

The number of actuators may vary;

The current may be adjusted by an external a/c voltage generator. In this modification of the invention any frequency that is desired within the target range may be applied;

Accordingly, the scope of the invention should be determined not by the embodiment illustrated, but by the appended claims and their legal equivalents.

We claim:

1. A vibrating apparatus comprising:

a rigid mounting member;

an actuator member having a first end portion, a second end portion, and an intermediate third portion located between said first and second end portions;
   wherein said actuator member is attached to said rigid mounting member at said intermediate third portion of said actuator member;
   wherein said first end portion of said actuator member extends outboard of said rigid mounting member;
   wherein said second end portion of said actuator member extends outboard of said rigid mounting member;
   and wherein said actuator member comprises a piezoelectric member;
   a housing member connected to said rigid mounting member wherein mechanical vibrations of said actuator member are transmitted through said rigid mounting member to said housing member;

and energizing means in communication with said actuator member for electrically energizing said actuator member.

2. The apparatus according to claim 1, wherein said energizing means comprises driver means by which alternating voltage may be applied to said piezoelectric member.

3. The apparatus according to claim 2, further comprising fastening means for fixedly securing said intermediate third portion of said actuator member to said rigid mounting member.

4. The apparatus according to claim 3, further comprising a first weight member;

wherein said first weight member is fixedly attached to said first end portion of said actuator member.

5. The apparatus according to claim 4, further comprising a second weight member;

wherein said second weight member is fixedly attached to said second end portion of said actuator member;
   such that said first weight member and said first end portion, and said second weight member and said second end portion may oscillate relative to said rigid mounting member, and said intermediate third portion of said actuator member may be substantially stationary relative to said rigid mounting member, when an alternating voltage is applied to said piezoelectric member.

6. The apparatus according to claim 5, wherein said piezoelectric member is prestressed.

7. A vibrating apparatus comprising:

a rigid mounting member;

an actuator member having first and second end portions;
   said first end portion of said actuator member being attached to said rigid mounting member;
   said second end portion of said actuator member extending outboard of said rigid mounting member;
   said actuator member comprising a mechanically prestressed piezoelectric member;
   a housing member connected to said rigid mounting member wherein mechanical vibrations of said actuator member are transmitted through said rigid mounting member to said housing member;

and energizing means in communication with said actuator member for electrically energizing said actuator member.

8. The apparatus according to claim 7, wherein said energizing means comprises driver means by which alternating voltage may be applied to said mechanically prestressed piezoelectric member.

9. The apparatus according to claim 8, further comprising a weight member fixedly attached to said second end portion of said actuator member;
   such that when an alternating voltage is applied to said mechanically prestressed piezoelectric member, said weight member and said second end portion of said actuator member may oscillate relative to said rigid mounting member, and said first end portion of said actuator member may be substantially stationary relative to said rigid mounting member.

* * * * *